United States Patent
Theivanayagam et al.

(10) Patent No.: US 11,292,938 B2
(45) Date of Patent: Apr. 5, 2022

(54) METHOD OF SELECTIVE CHEMICAL MECHANICAL POLISHING COBALT, ZIRCONIUM OXIDE, POLY-SILICON AND SILICON DIOXIDE FILMS

(71) Applicant: Rohm and Haas Electronic Materials CMP Holdings, Inc., Newark, DE (US)

(72) Inventors: Murali Ganth Theivanayagam, Newark, DE (US); Matthew Richard Van Hanehem, Middletown, DE (US); Yi Guo, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 281 days.

(21) Appl. No.: 16/567,064

(22) Filed: Sep. 11, 2019

(65) Prior Publication Data

US 2021/0071034 A1    Mar. 11, 2021

(51) Int. Cl.
| | |
|---|---|
| *C09G 1/02* | (2006.01) |
| *C09G 1/18* | (2006.01) |
| *C09K 3/14* | (2006.01) |
| *H01L 21/306* | (2006.01) |
| *B24B 37/04* | (2012.01) |
| *H01L 21/321* | (2006.01) |
| *C09G 1/04* | (2006.01) |
| *C09G 1/00* | (2006.01) |
| *B24B 1/00* | (2006.01) |
| *C09G 1/06* | (2006.01) |
| *C09K 13/06* | (2006.01) |

(52) U.S. Cl.
CPC .................. *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09G 1/18* (2013.01); *C09K 3/1409* (2013.01); *C09K 3/1463* (2013.01); *C09K 13/06* (2013.01); *H01L 21/30625* (2013.01); *H01L 21/3212* (2013.01)

(58) Field of Classification Search
CPC .......... C09G 1/02; C09G 1/18; C09K 3/1409; C09K 3/1463; H01L 21/30625; H01L 21/3212; B24B 37/044
See application file for complete search history.

(56) References Cited

U.S. PATENT DOCUMENTS

| | | | |
|---|---|---|---|
| 7,446,046 B2 | 11/2008 | Zhang et al. | |
| 8,394,694 B2 | 3/2013 | Lavoie et al. | |
| 8,431,490 B2 | 4/2013 | Guo et al. | |
| 9,786,976 B2 | 10/2017 | Wu et al. | |
| 9,865,510 B2 | 1/2018 | Chen et al. | |
| 9,929,272 B2 | 3/2018 | Huang et al. | |
| 9,997,457 B2 | 6/2018 | Jezewski et al. | |
| 10,170,335 B1* | 1/2019 | Theivanayagam | C09G 1/02 |
| 2008/0272366 A1* | 11/2008 | Moon | H01L 29/7839 257/24 |
| 2009/0014683 A1 | 1/2009 | Zhang et al. | |
| 2018/0340094 A1* | 11/2018 | Liang | H01L 21/3212 |

\* cited by examiner

*Primary Examiner* — Jiong-Ping Lu

(74) *Attorney, Agent, or Firm* — John J. Piskorski

(57) ABSTRACT

A process for chemical mechanical polishing a substrate containing cobalt, zirconium oxide, poly-silicon and silicon dioxide, wherein the cobalt, zirconium, and poly-silicon removal rates are selective over silicon dioxide. The chemical mechanical polishing composition includes water, a benzyltrialkyl quaternary ammonium compound, cobalt chelating agent, corrosion inhibitor, colloidal silica abrasive, optionally a biocide and optionally a pH adjusting agent, and a pH greater than 7, and the chemical mechanical polishing compositions are free of oxidizing agents.

11 Claims, No Drawings

METHOD OF SELECTIVE CHEMICAL MECHANICAL POLISHING COBALT, ZIRCONIUM OXIDE, POLY-SILICON AND SILICON DIOXIDE FILMS

FIELD OF THE INVENTION

The present invention is directed to a method of selective chemical mechanical polishing cobalt, zirconium oxide, poly-silicon and silicon dioxide films with a chemical mechanical polishing composition containing water, a benzyltrialkyl quaternary ammonium compound, cobalt chelating agent, corrosion inhibitor, colloidal silica abrasive, optionally a biocide and optionally a pH adjusting agent, and a pH greater than 7, and the chemical mechanical polishing composition is free of oxidizing agents. More specifically, the present invention is directed to a method of selective chemical polishing cobalt, zirconium oxide, poly-silicon and silicon dioxide films with a chemical mechanical polishing composition containing water, a benzyltrialkyl quaternary ammonium compound, cobalt chelating agent, corrosion inhibitor, colloidal silica abrasive, optionally a biocide and optionally a pH adjusting agent, and a pH greater than 7, and the chemical mechanical polishing composition is free of oxidizing agents, wherein the cobalt, zirconium oxide, and poly-silicon removal rates are selective over silicon dioxide.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by several deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry. However, there is a great deal of complexity involved in CMP. Each type of material requires a unique polishing composition, a properly designed polishing pad, optimized process settings for both polish and post-CMP clean and other factors that must be individually tailored to the application of polishing a given material.

In advanced logic nodes ≤10 nm, cobalt metal has replaced tungsten plug connecting the transistor gates to Back End of Line (BEOL) and the first few metal layers (M1 and M2—first and second interconnect metal layers in BEOL of a silicon chip) of copper interconnect metal in BEOL. Advanced logic node manufacturers (≤7 nm) are exploring new high-k dielectric films such as zirconium oxide in combination with cobalt, poly-silicon and silicon dioxide (Tetraethyl orthosilicate oxide) films. To enable the complex integration schemes comprising the above-mentioned films, it is desirable to demonstrate CMP slurry that can polish films with tunable removal rates and selectivity.

Therefore, there is a need for a CMP polishing method and composition for selectively polishing cobalt, zirconium oxide and poly-silicon over silicon dioxide.

SUMMARY OF THE INVENTION

The present invention provides a method of chemical mechanical polishing comprising: providing a substrate comprising cobalt, zirconium oxide, poly-silicon and silicon dioxide; providing a chemical mechanical polishing composition, comprising, as initial components: water, a colloidal silica abrasive, a cobalt chelating agent, a corrosion inhibitor, a benzyltrialkyl quaternary ammonium compound having a formula:

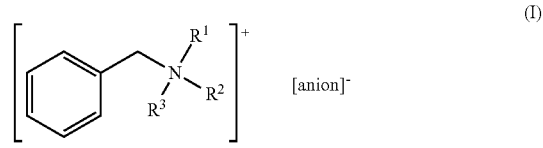

wherein $R^1$, $R^2$ and $R^3$ are each independently selected from a ($C_1$-$C_4$)alky group, and, optionally, a biocide; optionally, a pH adjusting agent, and a pH greater than 7, and the chemical mechanical polishing compositions is free of oxidizing agents; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the cobalt, zirconium oxide, poly-silicon and silicon dioxide is polished away from the substrate.

The present invention further provides a method of chemical mechanical polishing comprising: providing a substrate comprising cobalt, zirconium oxide, poly-silicon and silicon dioxide; providing a chemical mechanical polishing composition, comprising, as initial components: water, a colloidal silica abrasive having a negative zeta potential, a cobalt chelating agent, a corrosion inhibitor; a benzyltrialkyl quaternary ammonium compound having a formula:

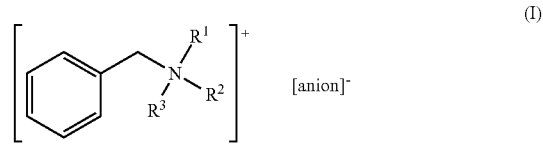

wherein $R^1$, $R^2$ and $R^3$ are each independently selected from a ($C_1$-$C_4$)alky group, and, optionally, a biocide; optionally, a pH adjusting agent, and a pH greater than 7, and the chemical mechanical polishing composition is free of oxidizing agents; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the cobalt, zirconium oxide, poly-silicon and silicon dioxide is polished away from the substrate.

The present invention further provides a method of chemical mechanical polishing comprising: providing a substrate comprising cobalt, zirconium oxide, poly-silicon and silicon dioxide; providing a chemical mechanical polishing composition, comprising, as initial components: water, a colloidal silica abrasive having a negative zeta potential, a cobalt chelating agent chosen from one or more amino acids, a corrosion inhibitor chosen from one or more heterocyclic nitrogen compound and nonaromatic polycarboxylic acids, a benzyltrialkyl quaternary ammonium compound having a formula:

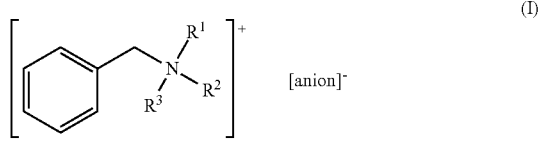

wherein $R^1$, $R^2$ and $R^3$ are each independently selected from a ($C_1$-$C_4$)alky group, and, a biocide; optionally, a pH adjusting agent, and a pH greater than 7, and the chemical mechanical polishing composition is free of oxidizing agents; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the cobalt, zirconium oxide, poly-silicon and silicon dioxide is polished away from the substrate.

The foregoing methods of the present invention include a chemical mechanical polishing composition comprising, as initial components, water, a colloidal silica abrasive, a cobalt chelating agent, a corrosion inhibitor, a benzyltrialkyl quaternary ammonium compound having a formula:

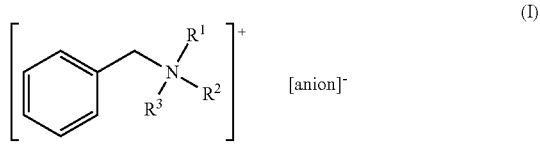

wherein $R^1$, $R^2$ and $R^3$ are each independently selected from a ($C_1$-$C_4$)alky group, and, optionally, a biocide; optionally, a pH adjusting agent, and a pH greater than 7, and the chemical mechanical polishing composition is free of oxidizing agents, wherein polishing cobalt, zirconium oxide and poly-silicon is selective over silicon dioxide.

DETAILED DESCRIPTION OF THE INVENTION

As used throughout this specification the following abbreviations have the following meanings, unless the context indicates otherwise: ° C.=degrees Centigrade; g=grams; L=liters; mL=milliliters; µ=µm=microns; kPa=kilopascal; Å=angstroms; mV=millivolts; DI=deionized; mm=millimeters; cm=centimeter; min=minute; sec=second; rpm=revolutions per minute; lbs=pounds; kg=kilograms; Co=cobalt; ZrOx, wherein x=1 to 2=zirconium oxide; BTMAH=benzyltrimethyl ammonium hydroxide; TBAH=tetrabutyl ammonium hydroxide; $H_2O_2$=hydrogen peroxide; KOH=potassium hydroxide; wt %=weight percent; PVD=physical vapor deposited; RR=removal rate; PS=polishing slurry; and CS=control slurry.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "poly-silicon" means polycrystalline silicon also called poly-Si a high purity, polycrystalline form of silicon which consists of small crystals or crystallites ≤1 mm and is distinct from monocrystalline silicon and amorphous silicon. The term "amino acid" means an organic compound containing amine (—$NH_2$) and carboxyl (—COOH) functional groups alone with a side chain (R group) specific to each amino acid. The term "TEOS" means the silicon dioxide formed from the decomposition of tetraethyl orthosilicate ($Si(OC_2H_5)_4$). The term "high-k" dielectric means the material, such as zirconium oxide, has a dielectric constant greater than silicon dioxide. The terms "a" and "an" refer to both the singular and the plural. All percentages are by weight, unless otherwise noted. All numerical ranges are inclusive and combinable in any order, except where it is logical that such numerical ranges are constrained to add up to 100%.

The method of polishing a substrate of the present invention, wherein the substrate includes cobalt, zirconium oxide, poly-silicon and silicon dioxide includes a chemical mechanical polishing composition which contains (preferably consists of), as initial components, water, a colloidal silica abrasive, a cobalt chelating agent, a corrosion inhibitor, a benzyltrialkyl quaternary ammonium compound having a formula:

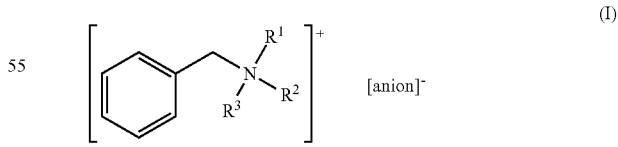

wherein $R^1$, $R^2$ and $R^3$ are each independently selected from a ($C_1$-$C_4$)alky group, wherein the anion is hydroxide, halide, nitrate, carbonate, sulfate, phosphate or acetate, and, optionally, a biocide; optionally a defoaming agent; optionally, a pH adjusting agent, and a pH greater than 7, and the chemical mechanical polishing composition is free of oxidizing agents to provide for the removal of at least some of the cobalt, zirconium oxide, poly-silicon and silicon dioxide from the substrate surface to provide cobalt, zirconium oxide and poly-silicon removal rate selectivity to silicon dioxide.

Preferably, in the method of polishing a substrate of the present invention, the water contained, as an initial component, in the chemical mechanical polishing composition provided is at least one of deionized and distilled to limit incidental impurities.

The chemical mechanical polishing composition used in the chemical mechanical polishing method of the present invention preferably contains, as an initial component, 0.01 to 5 wt % of a benzyltrialkyl quaternary ammonium compound having formula (I):

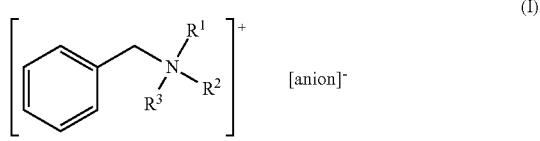

wherein $R^1$, $R^2$ and $R^3$ are each independently chosen from a ($C_1$-$C_4$)alky group, preferably, a ($C_1$-$C_2$)alkyl group, most preferably a methyl group; and wherein the anion is a counter anion to neutralize the positive (+) charge of the benzyltrialkyl quaternary ammonium cation, wherein the anion is hydroxide, halide, nitrate, carbonate, sulfate, phosphate or acetate, preferably, the anion is hydroxide or a halide, such as chloride, bromide, fluoride or iodide. Preferably, the halide is chloride or bromide. Most preferably, the halide is chloride. The chemical mechanical polishing composition of the present invention also contains, as an initial component, 0.1 to 3 wt %, more preferably 0.1 to 2 wt %, most preferably 0.2 to 1 wt % of the benzyltrialkyl quaternary ammonium compound having formula (I). Preferably, the benzyltrialkylammonium compound having formula (I) is benzyltrimethylammonium hydroxide or benzyltrimethylammonium chloride. Most preferably, the benzyltrialkylammonium compound having formula (I) is benzyltrimethylammonium hydroxide.

In the method of polishing a substrate of the present invention, the chemical mechanical polishing composition provided is free oxidizing agents. Oxidizing agents within the scope of the present invention are compounds utilized to form soft metal oxides that can be polished faster when compared to harder metal surfaces in the presence of appropriate slurry chemistry and pH. Such oxidizing agents which are excluded from the chemical mechanical polishing composition of the present invention include, but are not limited to, hydrogen peroxide ($H_2O_2$), monopersulfates, iodates, magnesium perphthalate, peracetic acid and other per-acids, persulfate, bromates, perbromate, persulfate, peracetic acid, periodate, nitrates, iron salts, cerium salts, Mn (III), Mn (IV) and Mn (VI) salts, silver salts, copper salts, chromium salts, cobalt salts, halogens, hypochlorites and a mixture thereof. Preferably the chemical mechanical polishing composition of the present invention is free of hydrogen peroxide, perchlorate, perbromate; periodate, persulfate, peracetic acid or mixtures thereof. Most preferably, the chemical mechanical polishing composition is free of the oxidizing agent hydrogen peroxide.

In the method of chemical mechanical polishing a substrate of the present invention, the chemical mechanical polishing composition includes colloidal silica abrasive particles. Preferably, in the method of polishing a substrate of the present invention, the chemical mechanical polishing composition provided contains a colloidal silica abrasive having a particle diameter of 200 nm or less and a negative zeta potential. More preferably, in the method of polishing a substrate of the present invention, the chemical mechanical polishing composition provided contains a colloidal silica abrasive having an average particle diameter of 200 nm or less and a permanent negative zeta potential, wherein the chemical mechanical polishing composition has a pH of greater than 7, preferably, from 8 to 13; more preferably, of 8.5 to 11; still more preferably, from 9 to 11; and most preferably 9 to 10.5. Still more preferably, in the method of polishing a substrate of the present invention, the chemical mechanical polishing composition provided contains a colloidal silica abrasive having an average particle diameter of 200 nm or less and a permanent negative zeta potential, wherein the chemical mechanical polishing composition has a pH of greater than 7, preferably, from 8 to 13; more preferably, of 8.5 to 11; still more preferably, of 9 to 11; and most preferably from 9 to 10.5, wherein a zeta potential is from −0.1 mV to −40 mV, preferably, from −10 mV to −38 mV, more preferably from −20 mV to −36 mV.

Preferably, in the method of polishing a substrate of the present invention, the chemical mechanical polishing composition provided contains, as an initial component, a colloidal silica abrasive having an average particle diameter of 200 nm or less, preferably, 5 nm to 200 nm; more preferably, 5 nm to less than 200 nm; even more preferably from 10 nm to 175 nm, still more preferably from 10 nm to 150 nm, most preferably, 20 nm to 100 nm, as measured by dynamic light scattering techniques or disk centrifuge method. Suitable particle size measuring instruments are available from, for example, Malvern Instruments (Malvern, UK) or CPS Instruments (Prairieville, La., USA).

Examples of commercially available colloidal silica particles are Fuso PL-3 or SH-3 (average particle diameter of 55 nm) available from Fuso Chemical Co., LTD.

Preferably, in the method of polishing a substrate of the present invention, the chemical mechanical polishing composition provided contains 0.01 wt % to 10 wt %, preferably 0.05 wt % to 5 wt %, more preferably, 0.1 wt % to 5 wt %, even more preferably, from 0.2 wt % to 5 wt %, and most preferably, from 1 wt % to 5 wt % of a colloidal silica abrasive having a particle diameter of less than or equal to 200 nm, preferably, 5 nm to 200 nm; more preferably, 5 nm to less than 175 nm; even more preferably from 10 nm to 150 nm, still more preferably from 20 nm to 150 nm, most preferably, 20 nm to 100 nm, as measured by dynamic light scattering techniques. Preferably the colloidal silica abrasive has a negative zeta potential.

In the method of polishing a substrate of the present invention, the chemical mechanical polishing composition provided contains, as an initial component, a corrosion inhibitor, wherein the corrosion inhibitor is selected from the group consisting of a heterocyclic nitrogen compound, a nonaromatic polycarboxylic acid, and mixtures thereof, wherein the heterocyclic nitrogen compound is selected from the group consisting of adenine, 1,2,4-triazole, imidazole, benzotriazole, polyimidazole and mixtures thereof; and, wherein the nonaromatic polycarboxylic acid includes, but is not limited to oxalic acid, succinic acid, adipic acid, maleic acid, malic acid, glutaric acid, citric acid, salts thereof or mixtures thereof. Preferably, the salts of the foregoing nonaromatic polycarboxylic acids are chosen from one or more of sodium, potassium and ammonium salts. When the chemical mechanical polishing composition includes a heterocyclic nitrogen compound in the method of chemical mechanical polishing a substrate of the present invention, preferably, as an initial component, the heterocyclic nitrogen compound is adenine. When the chemical mechanical polishing composition includes a nonaromatic polycarboxylic acid in the method of polishing a substrate of the present invention, the chemical mechanical polishing composition provided contains, as an initial component, preferably, the nonaromatic polycarboxylic acid is selected from the group consisting of malic acid, oxalic acid, adipic acid, citric acid, salts thereof and mixtures thereof. More preferably when the chemical mechanical polishing composition provided contains, as an initial component, a nonaromatic polycarboxylic acid, the nonaromatic polycarboxylic acid is selected from the group consisting of malic acid, citric acid, adipic acid, salts thereof and mixtures thereof. Most preferably, in the method of polishing a substrate of the present invention, when the chemical mechanical polishing composition provided contains, as an initial component, a nonaromatic polycarboxylic acid, the nonaromatic polycarboxylic acid is the nonaromatic dicarboxylic acid adipic acid or salts thereof, wherein, preferably, the salts are selected from the group consisting of sodium adipate, potassium adipate and ammonium adipate.

Corrosion inhibitors are included in the chemical mechanical polishing composition contain, as an initial component, 0.001 wt % to 1 wt %, more preferably, from 0.001 wt % to 0.05 wt %, even more preferably from 0.005 wt % to 0.01 wt % of a corrosion inhibitor selected from the group consisting of a heterocyclic nitrogen compound, a nonaromatic polycarboxylic acid and mixtures thereof, wherein the heterocyclic nitrogen compounds are selected from the group consisting of adenine, 1,2,4-triazole, imidazole, polyimidazole and mixtures thereof; and, wherein the nonaromatic polycarboxylic acid is selected from the group consisting of oxalic acid, succinic acid, adipic acid, maleic acid, malic acid, glutaric acid, citric acid, salts thereof and mixtures thereof. Preferably, in the method of polishing a substrate of the present invention, the chemical mechanical polishing composition provided contains, as an initial component, 0.001 to 1 wt %, more preferably, 0.001 to 0.05 wt %, most preferably, 0.005 wt % to 0.01 wt %, of the heterocyclic nitrogen compound adenine.

In the method of polishing a substrate of the present invention, the chemical mechanical polishing composition provided contains, as an initial component, a cobalt chelating agent. Preferably, the cobalt chelating agents are amino acids. Such amino acids include, but are not limited to, alanine, arginine, aspartic acid, cysteine, glutamine, glutamic acid, glycine, histidine, isoleucine, leucine, lysine methionine, phenylalanine, proline, serine, threonine, tryptophan, tyrosine, valine and mixtures thereof. Preferably, the amino acids are selected from the group consisting of alanine, arginine, glutamine, glycine, leucine, lysine, serine and mixtures thereof, more preferably, the amino acids are selected from the group consisting of alanine, glutamine, glycine, lysine, serine and mixtures thereof, even more preferably, the amino acids are selected from the group consisting of alanine, glycine, serine and mixtures thereof, most preferably, the amino acid is glycine.

Chelating agents are included in the chemical mechanical polishing composition, as an initial component, from 0.001 wt % to 1 wt %, more preferably, from 0.05 wt % to 0.5 wt %, even more preferably, from 0.05 wt % to 0.1 wt %, most preferably from, 0.025 wt % to 0.1 wt %.

In the method of polishing a substrate of the present invention, the chemical mechanical polishing composition provided has a pH of greater than 7. Preferably, in the method of polishing a substrate of the present invention, the chemical mechanical polishing composition provided has a pH of 8 to 13. More preferably, in the method of polishing a substrate of the present invention, the chemical mechanical polishing composition provided has a pH of 8.5 to 11; even more preferably from 9 to 11; and most preferably, in the method of polishing a substrate of the present invention, the chemical mechanical polishing composition provided has a pH of 9 to 10.5.

Preferably, in the method of polishing a substrate of the present invention, the chemical mechanical polishing composition provided, optionally, contains a pH adjusting agent. Preferably, the pH adjusting agent is selected from the group consisting of inorganic and organic pH adjusting agents. Preferably, the pH adjusting agent is selected from the group consisting of inorganic acids and inorganic bases. More preferably, the pH adjusting agent is selected from the group consisting of nitric acid and potassium hydroxide. Most preferably, the pH adjusting agent is potassium hydroxide.

Optionally, in the method of the present invention, the chemical mechanical polishing composition contains biocides, such as KORDEK™ MLX (9.5-9.9% methyl-4-isothiazolin-3-one, 89.1-89.5% water and ≤1.0% related reaction product) or KATHON™ CG/ICP II containing active ingredients of 2-methyl-4-isothiazolin-3-one and 5-chloro-2-methyl-4-isothiazolin-3-one, each manufactured by DuPont de Nemours Company, (KATHON and KORDEK are trademarks of DuPont).

In the method of polishing a substrate of the present invention, optionally, the chemical mechanical polishing composition provided can contain, as an initial component, 0.001 wt % to 0.1 wt %, preferably, 0.001 wt % to 0.05 wt %, more preferably, 0.01 wt % to 0.05 wt %, still more preferably, 0.01 wt % to 0.025 wt %, of biocide.

Optionally, in the method of the present invention, the chemical mechanical polishing composition can further include defoaming agents, such as non-ionic surfactants including esters, ethylene oxides, alcohols, ethoxylate, silicon compounds, fluorine compounds, ethers, glycosides and their derivatives. Anionic ether sulfates such as sodium lauryl either sulfate (SLES) as well as the potassium and ammonium salts. The surfactant can also be an amphoteric surfactant.

In the method of polishing a substrate of the present invention, optionally, the chemical mechanical polishing composition provided can contain, as an initial component, 0.001 wt % to 0.1 wt %, preferably, 0.001 wt % to 0.05 wt %, more preferably, 0.01 wt % to 0.05 wt %, still more preferably, 0.01 wt % to 0.025 wt %, of a defoaming agent.

Preferably, in the method of polishing a substrate of the present invention, the chemical mechanical polishing pad provided can be any suitable polishing pad known in the art. One of ordinary skill in the art knows to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 20.7 kPa normal to a surface of the substrate being polished.

Preferably, in the method of polishing a substrate of the present invention, the chemical mechanical polishing composition provided has a cobalt removal rate ≥900 Å/min; more preferably, ≥950 Å/min; further preferably, ≥960 Å/min; a ZrOx removal rate of ≥80 Å/min; more preferably, ≥100 Å/min; further preferably, ≥200 Å/min; a Poly-Si removal rate of ≥1200 Å/min, more preferably, ≥1400 Å/min, further preferably, ≥1500 Å/min; and, preferably, a Co:TEOS selectivity of ≥20, more preferably a Co:TEOS selectivity of ≥60:1; further preferably, a Co:TEOS selectivity of ≥70; preferably, a ZrOx:TEOS selectivity of ≥4:1; more preferably, a ZrOx:TEOS selectivity of ≥10:1; further preferably, a ZrOx:TEOS selectivity of ≥13:1; and, preferably, a Poly-Si:TEOS selectivity of 30:1, more preferably, a Poly-Si: TEOS selectivity of ≥100:1; and, with a platen speed of 120 revolutions per minute, a carrier speed of 117 revolutions per minute, a chemical mechanical polishing composition flow rate of 100 mL/min, a nominal down force of 20.7 kPa using 26 mm square coupon wafers on a Bruker Tribolab CMP polishing machine; and, wherein the chemical mechanical polishing pad comprises a polyurethane polishing layer containing polymeric hollow core microparticles and a polyurethane impregnated non-woven subpad.

The following examples are intended to illustrate the present invention but are not intended to limit its scope.

Example 1

Slurry Formulations

All the slurries in Table 1 used for polishing studies were prepared as mentioned in the following procedure. Glycine and adenine were added to de-ionized water and mixed using an overhead stirrer (300-450 RPM) until completely dissolved to make a final glycine concentration of 0.1 wt % and a final adenine concentration of 0.01 wt %, followed by pH adjustment to pH of 10.3 with dilute KOH solution (5% or 45%). The colloidal silica particles were obtained from Fuso chemical Co., LTD: Fuso SH-3 (55 nm average diameter cocoon shaped colloidal silica particles forming conjoined spheres having an average length of 70 nm, 34 wt % solids as received). The KORDEK™ MLX biocide was then added to the slurry followed by adding TBAH or BTMAH in the amounts shown in Table 1. Cleanroom grade $H_2O_2$ (30% solution) was added with stirring to achieve 0.3 wt % $H_2O_2$ concentration in the final slurry. The slurries were used on the same day or the day after $H_2O_2$ addition in the polishing experiments.

TABLE 1

Slurry Formulations

| Slurry | Glycine (wt %) | Adenine (wt %) | Tetrabutyl ammonium Hydroxide (TBAH) (wt %) | Benzyltrimethyl ammonium hydroxide (BTMAH) (wt %) | KORDEK™ MLX (wt %) | SH-3 (wt %) | pH | $H_2O_2$ (wt %) |
|---|---|---|---|---|---|---|---|---|
| CS 1 | 0.1 | 0.01 | | | 0.005 | 5.0 | 10.3 | 0 |
| CS 2 | 0.1 | 0.01 | 0.25 | | 0.005 | 5.0 | 10.3 | 0 |
| CS 3 | 0.1 | 0.01 | 0.50 | | 0.005 | 5.0 | 10.3 | 0 |
| CS 4 | 0.1 | 0.01 | 0.75 | | 0.005 | 5.0 | 10.3 | 0 |
| CS 5 | 0.1 | 0.01 | 1.00 | | 0.005 | 5.0 | 10.3 | 0 |
| CS 6 | 0.1 | 0.01 | | | 0.005 | 5.0 | 10.3 | 0.3 |
| CS 7 | 0.1 | 0.01 | | 0.25 | 0.005 | 5.0 | 10.3 | 0.3 |
| CS 8 | 0.1 | 0.01 | | 0.50 | 0.005 | 5.0 | 10.3 | 0.3 |
| CS 9 | 0.1 | 0.01 | | 1.00 | 0.005 | 5.0 | 10.3 | 0.3 |
| PS 1 | 0.1 | 0.01 | | 0.25 | 0.005 | 5.0 | 10.3 | 0 |
| PS 2 | 0.1 | 0.01 | | 0.50 | 0.005 | 5.0 | 10.3 | 0 |
| PS 3 | 0.1 | 0.01 | | 0.75 | 0.005 | 5.0 | 10.3 | 0 |
| PS 4 | 0.1 | 0.01 | | 1.00 | 0.005 | 5.0 | 10.3 | 0 |

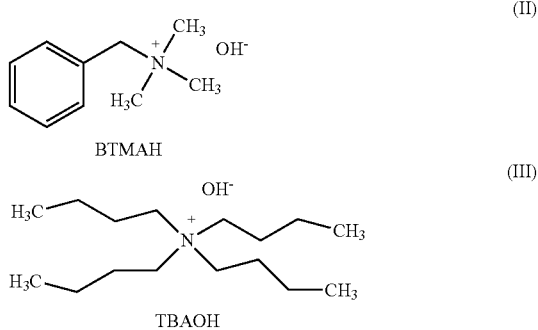

Example 2

Polishing Experiments

The following cobalt, zirconium oxide, poly-silicon and silicon dioxide polishing experiments were performed with the slurries disclosed in Table 1 in Example 1 above.

TABLE 2

CMP Polishing and Cleaning Conditions

| | |
|---|---|
| Polishing Tool | Bruker TRIBOLAB CMP System |
| Pad | VISIONPAD ™ 6000 D37AR--a polyurethane; Shore D hardness of 57, 30 and 60 µm average diameter closed cell pores and circular grooves having a depth, width and pitch of 760, 510 and 3,050 µm, respectively |
| Conditioner | AK45 Ex-Situ-170 µm diamond size; 40 µm diamond protrusion and 310 µm diamond spacing |
| Process | 3 PSI (20.7 kPa), 120/117 RPM, 100 mL/min (Downforce, Platen Speed/Carrier Speed, Slurry Flow Rate) |
| Post CMP clean | DI Water |
| Polish Time | Co Wafer: 20 sec, ZrOx: 30 sec, Poly-Si: 10 sec and TEOS Wafer: 60 sec (polishing times were set different for Co, ZrOx, Poly-Si and TEOS due to the differences in their removal rates and film thickness and the need to have sufficient Co film remaining to measure the removal rates accurately). |

Cobalt film thickness was measured with OMNIMAP™ RS200 and zirconium oxide, poly Si, and TEOS film thickness were measured with Asset F5x measurement tool both by KLA Corporation. Polishing results are in Table 3 below.

TABLE 3

Removal Rate (Å/min) and Selectivity

| Slurry | Cobalt | Poly-Si | ZrO$_x$ | TEOS | Co:TEOS | Poly-Si:TEOS | ZrO$_x$:TEOS |
|---|---|---|---|---|---|---|---|
| CS 1 | 1007 | 1544 | 184 | 326 | 3.1 | 4.7 | 0.6 |
| CS 2 | 958 | 1587 | 193 | 297 | 3.2 | 5.3 | 0.6 |
| CS 3 | 931 | 1280 | 165 | 213 | 4.4 | 6.0 | 0.8 |
| CS 4 | 991 | 1494 | 173 | 204 | 4.9 | 7.3 | 0.8 |
| CS 5 | 929 | 1438 | 143 | 127 | 7.3 | 11.3 | 1.1 |
| CS 6 | 136 | 2058 | 140 | 283 | 0.5 | 0.5 | 7.3 |
| CS 7 | 89 | 288 | 85 | 60 | 1.5 | 1.4 | 4.8 |
| CS 8 | 73 | 101 | 59 | 23 | 3.1 | 2.5 | 4.3 |
| CS 9 | 0 | 27 | 30 | 8 | 0.0 | 3.8 | 3.4 |
| PS 1 | 979 | 1604 | 221 | 48 | 20.5 | 33.6 | 4.6 |
| PS 2 | 967 | 1584 | 206 | 15 | 64.6 | 105.8 | 13.8 |
| PS 3 | 963 | 1408 | 143 | 14 | 70.3 | 102.8 | 10.5 |
| PS 4 | 968 | 1250 | 83 | 11 | 84.7 | 109.3 | 7.3 |

Example 3

Static Etch Rate (Corrosion) Analysis

Blanket Co wafers from Novati Technologies (200 mm, ~1700 Å thick PVD Co deposited on to silicon substrate) were used as received. Gamry PTC1™ paint test cells were used for analysis, the whole 200 mm Co wafer was clamped between a glass tube with an O-ring seal and a custom-made TEFLON™ base. 3M-470, electroplaters tape with 3.0 cm$^2$ of open area was used in-between the wafer and the O-ring to avoid any crevice or stress type local corrosion. For high temperature analysis, 30 mL of static-etch slurry was kept in an oven at 55° C. to simulate higher local temperatures at pad asperity/wafer contact during polishing, and pre-heated for 60 min and then the slurry was immediately added to the static-etch cell and kept in contact with the wafer for 3 min. After the desired hold time, the static-etch solution was collected and analyzed for Co ions by Inductively Coupled Plasma—Optical Emission Spectrometer (ICP-OES) analysis after centrifuging and separating the colloidal silica abrasives when present in the formulation. Colloidal silica abrasives were excluded from some formulations in static-etch experiments for ease of ICP-OES analysis. At least two data points were collected for all the slurries tested to check for reproducibility.

Cobalt static-etch rates (SER) were calculated from cobalt concentration in ICP analysis using the following formula:

$$\text{Cobalt SER (Å/min)} = \{[C\ (g/L) * V\ (l)] / [A\ (cm^2) * D\ (g/cm^3) * T\ (min)]\} * 10^{8}$$

C=Co concentration from ICP analysis (g/l)
V=Volume of test solution used added in static etch setup (l)
A=Area of cobalt metal exposed to the test solution (cm$^2$)
D=Density of cobalt (8.9 g/cm$^3$)
T=Time of exposure (min)
$10^{8}$=cm to Å unit conversion

TABLE 4

55° C. Static-etch Rate (Å/min)

| Slurry | Cobalt |
|---|---|
| CS 1 | <1.5 |
| CS 2 | <1.5 |
| CS 3 | <1.5 |
| CS 4 | <1.5 |
| CS 5 | <1.5 |
| CS 6 | 2.1 |
| CS 7 | 1.7 |
| CS 8 | 1.8 |
| CS 9 | 2.0 |
| PS 1 | <1.5 |
| PS 2 | <1.5 |
| PS 3 | <1.5 |
| PS 4 | <1.5 |

What is claimed is:
1. A method of chemical mechanical polishing method, comprising: providing a substrate comprising cobalt, zirconium oxide, poly-silicon and silicon dioxide on a surface to be polished; providing a chemical mechanical polishing composition, comprising, as initial components: water, a colloidal silica abrasive, a cobalt chelating agent, a corrosion inhibitor, a benzyltrialkyl quaternary ammonium compound having a formula:

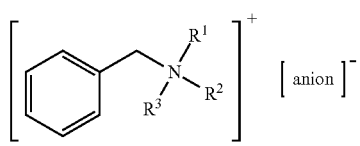

wherein $R^1$, $R^2$ and $R^3$ are each independently selected from a (C1-C4)alky group, a pH greater than 7, and the chemical mechanical polishing composition is free of oxidizing agents; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate to remove at least some of the cobalt, zirconium oxide, poly-silicon and silicon dioxide.

2. The method of claim 1, wherein the benzyltrialkyl quaternary ammonium compound is in amounts of 0.1-3wt %.

3. The method of claim 1, wherein the the benzyltrialkyl quaternary ammonium compound is selected from the group consisting of benzyltrimethylammonium hydroxide, benzyltrimethylammonium chloride and mixtures thereof.

4. The method of claim 1, wherein the anion is selected from the group consisting of hydroxide, halide, nitrate, carbonate, sulfate, phosphate and acetate.

5. The method of claim 1, wherein the corrosion inhibitor is a heterocyclic nitrogen compound, an aromatic polycarboxylic acid or mixtures thereof.

6. The method of claim 1, wherein the chelating agent is an amino acid.

7. The method of claim 6, wherein the amino acid is selected from the group consisting of alanine, arginine, aspartic acid, cysteine, glutamine, glutamic acid, glycine, histidine, isoleucine, leucine, lysine methionine, phenylalanine, proline, serine, threonine, tryptophan, tyrosine, valine and mixtures thereof.

8. The method of claim 1, wherein the pH is from 8-13.

9. The method of claim 1, wherein the chemical mechanical polishing composition further comprises a biocide.

10. The method of claim 1, wherein the chemical mechanical polishing composition further comprises a pH adjusting agent.

11. The method of claim 1, wherein the chemical mechanical polishing composition further comprises a defoaming agent.

* * * * *